United States Patent
Darshan (10) Patent No.: US 10,528,112 B2
(45) Date of Patent: Jan. 7, 2020

(54) MPS GENERATION SYSTEM AND METHOD

(71) Applicant: Microsemi P.O.E Ltd., Hod Hasharon (IL)

(72) Inventor: Yair Darshan, Petach Tikva (IL)

(73) Assignee: MICROSEMI P.O.E. LTD., Hod Hasharon (IL)

( * ) Notice: Subject to any disclaimer, the term of this patent is extended or adjusted under 35 U.S.C. 154(b) by 43 days.

(21) Appl. No.: 15/684,999

(22) Filed: Aug. 24, 2017

(65) Prior Publication Data

US 2018/0074567 A1 Mar. 15, 2018

Related U.S. Application Data (60) Provisional application No. 62/393,060, filed on Sep. 11, 2016.

(51) Int. Cl.
| | |
|---|---|
| *G06F 1/3209* | (2019.01) |
| *H04L 12/40* | (2006.01) |
| *G06F 1/26* | (2006.01) |
| *G06F 1/3206* | (2019.01) |
| *G01R 27/16* | (2006.01) |
| *G05F 1/70* | (2006.01) |
| *G05F 3/30* | (2006.01) |
| *H02J 3/02* | (2006.01) |
| *H04L 12/10* | (2006.01) |

(52) U.S. Cl.
CPC .......... *G06F 1/3209* (2013.01); *G01R 27/16* (2013.01); *G05F 1/70* (2013.01); *G05F 3/30* (2013.01); *G06F 1/266* (2013.01); *G06F 1/3206* (2013.01); *H02J 3/02* (2013.01); *H04L 12/10* (2013.01); *H04L 12/40045* (2013.01)

(58) Field of Classification Search
CPC ...... G06F 1/3209; G06F 1/266; G06F 1/3206; G01R 27/16; G05F 1/70; G05F 3/30; H02J 3/02; H04L 12/10; H04L 12/40045
USPC .................. 713/320; 323/312, 208; 710/313; 324/654; 361/18
See application file for complete search history.

(56) References Cited

U.S. PATENT DOCUMENTS

| | | | |
|---|---|---|---|
| 7,373,528 B2 | 5/2008 | Schindler | |
| 7,449,796 B2 | 11/2008 | Elkayam et al. | |
| 7,484,109 B2 | 1/2009 | Feldman et al. | |
| 8,581,438 B2 | 11/2013 | Heath et al. | |

(Continued)

OTHER PUBLICATIONS

A Balancing Arrangement for Four Pair Power Over Ethernet, published on ip.com as IPCOM000191162D, Dec. 20, 2009.

(Continued)

*Primary Examiner* — Aurel Prifti
(74) *Attorney, Agent, or Firm* — Glass and Associates; Kenneth Glass; Kenneth D'Alessandro (57) ABSTRACT

An MPS generation method, the method constituted of: at a predetermined frequency, alternately outputting a first MPS current pulse for a predetermined first time period and not outputting the first MPS current pulse for a predetermined first off time period; during the first time period, determining the magnitude of a current drawn by an input capacitor of a DC to DC converter; and responsive to the determined input capacitor current magnitude, outputting between the first terminal and the second terminal a second MPS current pulse for a predetermined second time period during the predetermined first off time period.

16 Claims, 6 Drawing Sheets

(56) References Cited

U.S. PATENT DOCUMENTS

| | | | |
|---|---|---|---|
| 2008/0062586 A1* | 3/2008 | Apfel | H04L 12/10 361/18 |
| 2011/0215776 A1* | 9/2011 | Sheen | G05F 1/46 323/208 |
| 2012/0060042 A1* | 3/2012 | Buhari | G06F 1/266 713/320 |
| 2013/0154603 A1* | 6/2013 | Cerutti | G05F 3/02 323/312 |
| 2013/0257151 A1* | 10/2013 | Brooksbank | G06F 1/266 307/17 |
| 2014/0203822 A1* | 7/2014 | Tsai | G06F 1/26 324/654 |
| 2016/0162428 A1* | 6/2016 | Nathadi | G06F 1/26 710/313 |
| 2016/0197734 A1 | 7/2016 | Darshan et al. | |
| 2016/0197735 A1 | 7/2016 | Ferentz | |
| 2017/0012788 A1 | 1/2017 | Rimboim et al. | |

OTHER PUBLICATIONS

International Search Report for PCT/IL2017/050965 issued by European Patent Office dated Dec. 11, 2017.
Written Opinion of the International Searching Authority for PCT/IL2017/050965 issued by European Patent Office dated Dec. 11, 2017.

* cited by examiner

FIG. 4B

MPS GENERATION SYSTEM AND METHOD

TECHNICAL FIELD

The invention relates generally to the field of powered device (PD) interfaces and in particular to a maintain power signature (MPS) generation system and method.

BACKGROUND

In Power over Ethernet (PoE) systems, the power sourcing equipment (PSE) is arranged to disconnect the power when it detects that no PD is drawing current. Particularly, the PSE is arranged to detect whether there is a predetermined minimum current being drawn for a predetermined minimum time period over a predetermined window. A PD providing this predetermined minimum current over the predetermined minimum time period is said to provide a maintain power signature (MPS). Thus, in order to keep the PSE from shutting down the port when a PD is in standby mode, the PD generates an MPS which will draw current from the PSE with a magnitude greater than the predetermined minimum current threshold. In order to reduce the power consumption during the standby mode of the PD, the MPS current drawn is modulated. For Type 1 and 2 PDs, the PSE needs to detect a current of at least 10 mA for a minimum period of 60 ms over a 360 ms window. Typically, the PD is arranged to draw 10 mA of current for 75 ms with an off time of 250 ms, called a long MPS pulse. For Type 3 and 4 PDs, the PSE needs to detect the minimum predetermined current for a minimum of 6 ms over a 326 ms window, i.e. with an off time of no more than 320 ms. Thus, in order to ensure compliance, the PD is arranged to generate MPS pulses of 7 ms with an off period of less than or equal to 310 ms, preferably with an off time of 250 ms, the 7 ms pulsed called a short MPS pulse. An MPS pulse is thus a current pulse of a predetermined duration.

Figure 1:
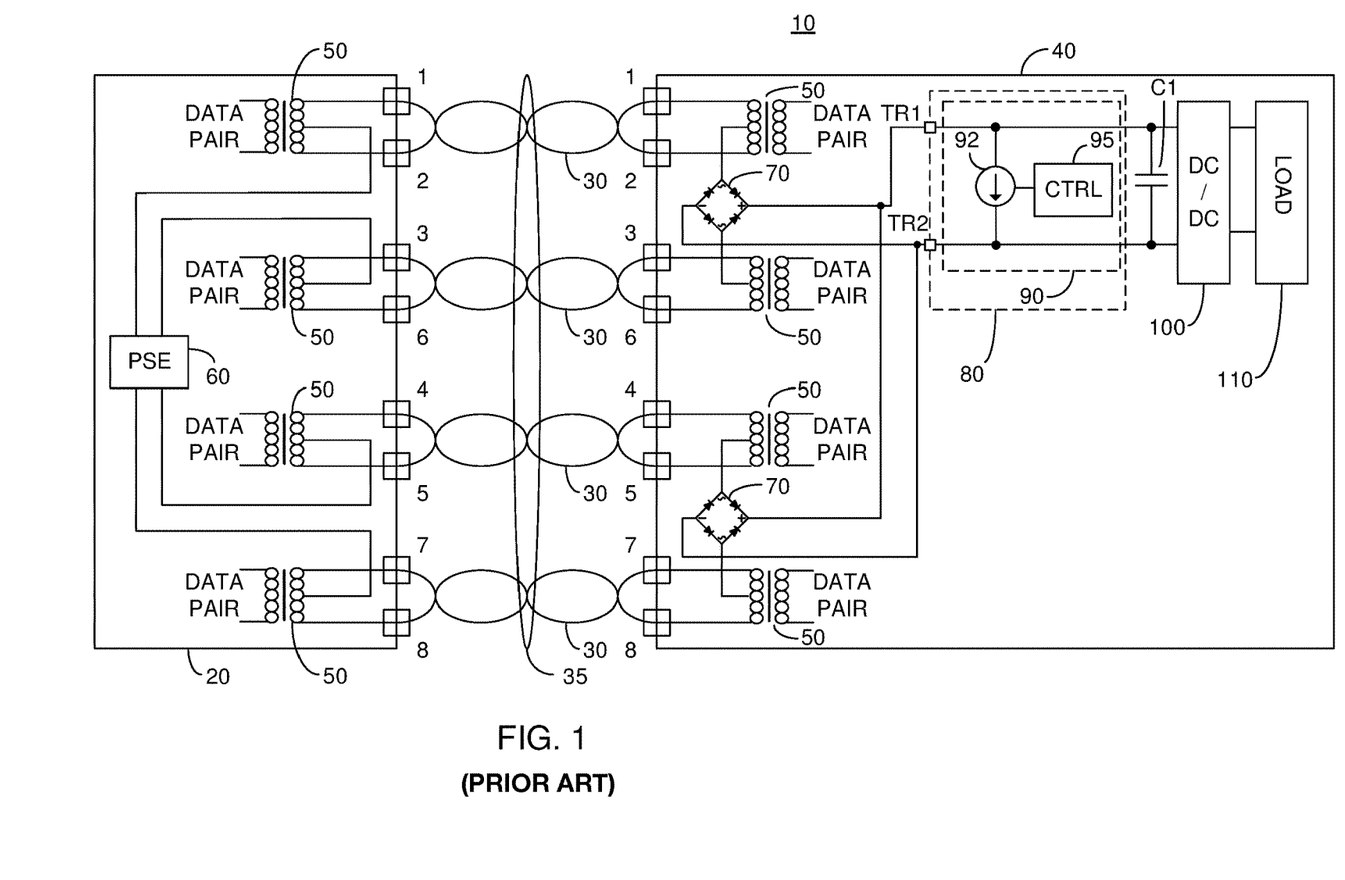
FIG. 1 illustrates a high level schematic diagram of a PoE system according to the prior art.

FIG. 1 illustrates a high level schematic diagram of a PoE system 10, comprising: a switch/hub 20; a plurality of twisted pairs 30 constituted within a structured cable 35; and a PD 40. Switch/hub 20 comprises: a plurality of data transformers 50 and a PSE 60. PD 40 comprises: a plurality of data transformers 50; a pair of diode bridges 70; a PD interface 80 comprising an MPS circuitry 90; a capacitor C1; a DC/DC converter 100; and a load 110. MPS circuitry 90 is illustrated as a controlled current source 92 coupled to a control circuitry 95, and responsive thereto, however this is not meant to be limiting in any way. In another embodiment, MPS circuitry 90 may be constructed of a controllable resistor whose value is selected to ensure that the requirements of MPS are provided.

A data pair is coupled across the primary of each data transformer 50 in switch/hub 20 and a first end of each twisted pair 30 is coupled across the secondary of each data transformer 50 in switch/hub 20 via respective connections, listed conventionally in two groups: connections 1, 2, 3, 6; and connections 4, 5, 7 and 8. The outputs of PSE 60 are respectively connected to the center taps of the secondary windings of data transformers 50 of switch/hub 20. Structured cable 35 typically comprises 4 twisted pairs 30.

A data pair is connected across the primary winding of each data transformer 50 of PD 40 and a second end of each twisted pair 30 is connected across the secondary winding of each data transformer 50 of PD 40 via respective connections, listed conventionally in two groups: connections 1, 2, 3, 6; and connections 4, 5, 7 and 8. The center taps of the secondary windings of a first pair of data transformers 50 of PD 40 are each connected to a respective terminal of a first diode bridge 70 and the center taps of the secondary winding of a second pair of data transformers 50 of PD 40 are each connected to a respective terminal of a second diode bridge 70. A first input of PD interface 80 is coupled to a positive terminal of first and second diode bridges 70 and a second input of PD interface 80 is coupled to a negative terminal of first and second diode bridges 70. The inputs of PD interface 80, denoted terminal TR1, TR2, are coupled to respective inputs of DC/DC converter 100, with capacitor C1 and MPS circuitry 90 coupled in parallel across the inputs of PD interface 80; terminal TR1 and terminal TR2. Load 110 is coupled to PD interface 80 via DC/DC power converter 100. PD interface 80 is illustrated herein as comprising only MPS circuitry 90, however this is not meant to be limiting in any way. Particularly, PD interface 80 further comprises dedicated circuitries (not shown) for detection and classification.

In operation, as described above, MPS circuitry 90 is arranged to generate an MPS pulse which, after start up is completed, ensures that a minimum amount of current is drawn from PSE 60 for a predetermined time over a predetermined window. Typically MPS circuitry 90 is only active when load 110 is in standby mode. Control circuitry 95 of MPS circuitry 90 may receive an input from load 110 indicating that load 110 is in a standby mode, and in response control circuitry 95 regularly energizes current source 92 to generate the required MPS pulses. Due to load changes, or cross port load regulation, there may be short term changes in the voltage output by PSE 60, with durations up to 10 ms in a typical multi-port system. The current drawn by a capacitor is given as:

$$i_C = C^*(dV_C/dt) \qquad \text{EQ. 1}$$

where C is the capacitance of the capacitor and $V_C$ is the voltage thereacross. Therefore, when the voltage output by PSE 60 is fixed, $V_C$ of capacitor C1 will also be fixed and the current $i_C$ drawn by capacitor C1 will be zero. In such a case, when load 110 is idle, the only current drawn from PSE 60 will be from MPS circuitry 90. However, when the voltage output by PSE 60 changes, as described above, voltage $V_C$ of capacitor C1 will change accordingly thereby generating a current $i_C$. When attempting to detect whether a minimum current is being drawn therefrom, PSE 60 will be detecting the combination of the current drawn by MPS circuitry 90 and current $i_C$ drawn by capacitor C1. If MPS circuitry 90 is generating a short MPS, i.e. an MPS of 6-7 ms, current $i_C$ can distort or even cancel the short MPS, in the event that they are contemporaneous, since the changes in PSE voltage due to cross-regulation can last up to 10 ms, as indicated above.

SUMMARY OF THE INVENTION

Accordingly, it is a principal object of the present invention to overcome at least some of the disadvantages of prior art MPS generation systems. This is accomplished in one embodiment by detecting the presence of a capacitor current $i_C$ during output of a short MPS pulse, optionally detected by detecting the combination of the MPS current pulse and capacitor current $i_C$ and comparing it to pre-defined MPS pulse parameters. In the event that the magnitude of the capacitor current $i_C$ is greater than a predetermined value for enough time to interfere with the short MPS pulse, a second MPS pulse is generated, optionally the second MPS pulse being a long MPS pulse.

In particular, a powered device (PD) interface is enabled comprising: a first terminal and a second terminal arranged for connection towards a power supply equipment; a maintain power signature (MPS) circuitry; a current sense circuitry arranged to sense the magnitude of a current flowing therethrough; and a control circuitry in communication with the current sense circuitry, the MPS circuitry responsive to the control circuitry, wherein the MPS circuitry is arranged, at a predetermined frequency, responsive to the control circuitry, to alternately: output a first current pulse for a predetermined first time period; and not output the first current pulse for a predetermined first off time period, wherein the control circuitry is arranged, responsive to the sensed current magnitude, to determine the magnitude of a current drawn by an input capacitor of a direct-current to direct-current (DC to DC) converter, and wherein the control circuitry is arranged, responsive to the determined input capacitor current magnitude, to control the MPS circuitry to output a second current pulse for a predetermined second time period during the predetermined first off time period.

In one embodiment, the current sense circuitry is coupled between the MPS circuitry and one of the first terminal and the second terminal, and wherein the input capacitor current magnitude determination comprises a comparison of the sensed current magnitude with the magnitude of the first current pulse. In another embodiment, the current sense circuitry is coupled between the MPS circuitry and the DC to DC converter input capacitor.

In one embodiment, the predetermined second time period is greater than the predetermined first time period. In another embodiment, the MPS circuitry is further arranged to: upon completion of the output second current pulse, not output either of the first current pulse or the second current pulse for a predetermined second off time period; and upon completion of the second off time period, output the first current pulse. In one further embodiment, the length of the predetermined second off time period is generally equal to the length of the predetermined first off time period. In another further embodiment, the length of the predetermined second off time period is set such that the predetermined frequency is maintained.

Independently, the present embodiments enable a maintain power signature (MPS) generation method, the method comprising: at a predetermined frequency, alternately outputting a first MPS current pulse for a predetermined first time period and not outputting the first MPS current pulse for a predetermined first off time period; during the first time period, determining the magnitude of a current drawn by an input capacitor of a direct-current to direct-current (DC to DC) converter; and responsive to the determined input capacitor current magnitude, outputting between the first terminal and the second terminal a second MPS current pulse for a predetermined second time period during the predetermined first off time period.

In one embodiment, the input capacitor current magnitude determination comprises: sensing the magnitude of a combination of the output first MPS current pulse and the input capacitor current; and comparing the sensed combination current magnitude with the magnitude of the output first MPS current pulse, the second current pulse output only in the event that the sensed combination current magnitude is less than the current pulse magnitude for a predetermined evaluation time period. In another embodiment, the input capacitor current magnitude determination comprises sensing the magnitude of current being drawn by the input capacitor. In another embodiment, the predetermined second time period is greater than the predetermined first time period.

In one embodiment, the method further comprises: upon completion of the output second current pulse, not outputting the either of the first current pulse or the second current pulse for a predetermined second off time period; and upon completion of the predetermined second off time period, outputting the first current pulse. In one further embodiment, the length of the predetermined second off time period is generally equal to the length of the predetermined first off time period. In another further embodiment, the length of the predetermined second off time period is set such that the predetermined frequency is maintained.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding sections or elements throughout. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. The term 'resistor' as used herein is meant to include, without limitation, any suitable element providing electrical resistance. The term 'inductor' as used herein is meant to include, without limitation, any suitable element providing electrical inductance. The term 'capacitor' as used herein is meant to include, without limitation, any suitable element providing electrical capacitance. In the accompanying drawings.

DETAILED DESCRIPTION OF THE PREFERRED EMBODIMENTS

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 2A:
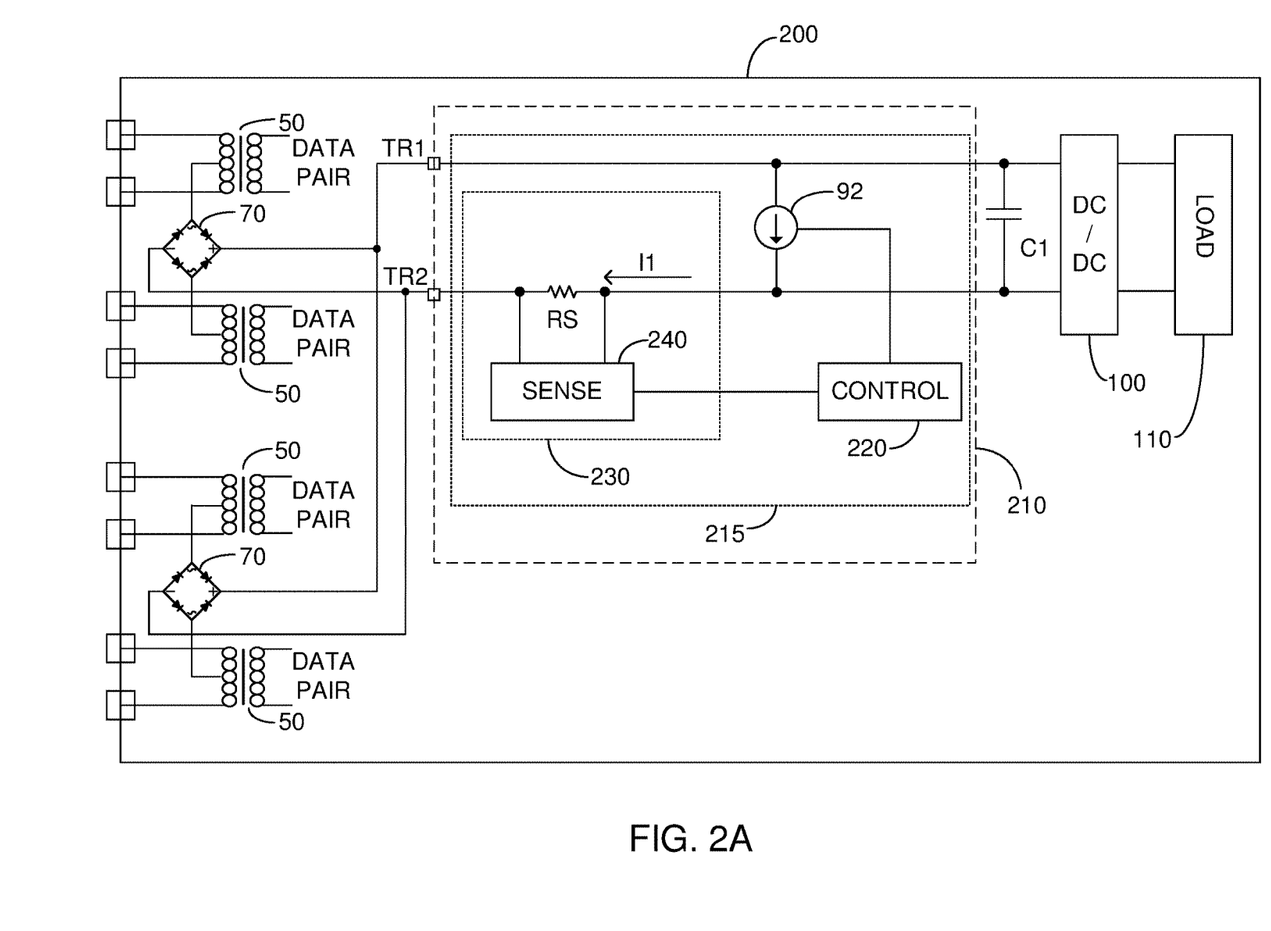
FIG. 2A illustrates a high level schematic diagram of a first embodiment of a PD according to certain embodiments.

FIG. 2A illustrates a high level schematic diagram of a PD 200. PD 200 comprises: a plurality of data transformers 50; a pair of diode bridges 70; a PD interface 210; a DC/DC converter 100; and a load 110. PD interface 210 comprises: an MPS circuitry 215 comprising a current source 92; a control circuitry 220; and a current sense circuitry 230. Current sense circuitry 230 comprises: a sense resistor RS; and a sense functionality 240. Sense resistor RS represents a common implementation of a current sense device, it being understood that other current sensors, including Hall sensor and current mirror based sensors may be utilized without exceeding the scope. Sense functionality 240 is illustrated as being separate from control circuitry 220, however this is not meant to be limiting in any way and in another embodiment sense functionality 240 is implemented within control circuitry 220. Sense functionality 240 may be implemented in one embodiment as a differential amplifier feeding and an analog to digital (A/D) converter. PD interface 210 is in one embodiment implemented as a single integrated circuit. PD 200 is illustrated as comprising a pair of diode bridges 70, however this is not meant to be limiting in any way. In another embodiment, diode bridges 70 are replaced with bridges of electronically controlled switches, as described in U.S. patent application publication S/N US 2015/0372826, published on Dec. 24, 2015 to Blaut et al., the entire contents of which are incorporated herein by reference.

A data pair is connected across the primary winding of each data transformer 50 of PD 200 and the secondary winding of each data transformer 50 of PD 200 is coupled to a respective wire pair (not shown), as described above. The center taps of the secondary windings of a first pair of data transformers 50 of PD 200 are each connected to a respective terminal of a first diode bridge 70 and the center taps of the secondary winding of a second pair of data transformers 50 of PD 200 are each connected to a respective terminal of a second diode bridge 70. A positive terminal of each of first and second diode bridges 70 is coupled to a first terminal of PD interface 210, denoted TR1, and a negative terminal of each of first and second diode bridges 70 is coupled to a second terminal of PD interface 210, denoted TR2. First terminal TR1 of PD interface 210 is coupled to a first end of current source 92 of MPS circuitry 215 and to a first end of capacitor C1. Second terminal TR2 of PD interface 210 is coupled to a first end of sense resistor RS and a first input of sense functionality 240. A second end of sense resistor RS is coupled to a second input of sense functionality 240 and second end of current source 92 of MPS circuitry 215 and a second end of capacitor C1. Capacitor C1 is further coupled across the input of DC/DC converter 100 and load 110 is coupled across the output of DC/DC converter 100. terminal TR2 Although DC/DC converter 100 and capacitor C1 are illustrated as being outside of PD interface 210, this is not meant to be limiting in any way. Additionally, PD interface 210 is illustrated herein as comprising only MPS circuitry 215, control circuitry 220 and current sense circuitry 230, however this is not meant to be limiting in any way. Particularly, PD interface 210 preferably further comprises dedicated circuitries (not shown) for detection and classification, as known to those skilled in the art at the time of the invention. Although sense resistor RS is illustrated as being coupled between terminal TR2 of PD interface 210 and an input of DC/DC converter 100, this is not meant to be limiting in any way. In another embodiment, sense resistor RS is coupled between terminal TR1 of PD interface 210 and an input DC/DC converter 100, without exceeding the scope.

In operation, as described above, when load 110 is in a standby mode MPS circuitry 215 is arranged, responsive to control circuitry 220, to periodically generate a short MPS pulse, for a predetermined first time period, between terminals TR1 and TR2 and then not generate an MPS pulse for a predetermined second time period. As described above, the predetermined first time period is at least 7 ms and the predetermined second time period is up to 310 ms.

In one preferred embodiment, as described above, the magnitude of the current drawn by the generated MPS is at least 10 mA. MPS circuitry 215 is arranged to periodically generate the short MPS pulses, at a predetermined frequency, such that the short MPS pulse is output for the first time period followed by a predetermined off time of up to 310 ms, preferably about 250 ms.

The current flowing through sense resistor RS, which comprises a combination of the current drawn by the generated MPS pulse and any current is drawn by capacitor C1 in response to a change in the voltage output by PSE 60, is denoted I1. Sense functionality 240 is arranged to sense the voltage across sense resistor RS and responsive thereto determine the magnitude of current I1. In one embodiment, control circuitry 220 is arranged to control sense functionality 240 to sense the voltage across sense resistor RS only when MPS circuitry 215 is outputting the short MPS pulse. In another embodiment, control sense functionality 240 is arranged to continuously monitor the voltage across sense resistor RS.

Control circuitry 220 is arranged to compare the determined magnitude of current I1, which was flowing through sense resistor RS during the first time period where MPS circuitry 215 was outputting the short MPS pulse, with a predetermined magnitude value. Particularly, the predetermined magnitude value is the value of the nominal magnitude of the current drawn by the short MPS pulse. In one embodiment control circuitry 220 comprises a comparing circuitry. In the event that the determined magnitude of current I1 is less than the nominal magnitude value by at least a predetermined difference, control circuitry 220 is arranged to control MPS circuitry 215 to generate a second MPS pulse. In one embodiment, the second MPS pulse is generated responsive to the determined magnitude of current I1 being less than the nomimal predetermined magnitude value, by at least the predetermined difference, for at least a predetermined error time period. In one embodiment, the predetermined difference is 0.5 mA. In another embodiment, the predetermined error time period is 0.5 ms.

In one embodiment, the second MPS pulse generated by MPS circuitry 215 is a long MPS pulse, optionally 75 ms long. As described above, the spike of current $i_C$ generally lasts less than 10 ms. Therefore, for an MPS pulse of 75 ms a current spike of several milliseconds will interfere with only a small portion of the second MPS pulse. As a result, PSE 60 will still be able to detect the second MPS pulse and not shut down the port.

In another embodiment, the timing of the periodic MPS generation is reset when generating the second MPS. This embodiment of the MPS timing reset will be herein described in relation to FIG. 2B, which illustrates a graph 300 of the output of MPS circuitry 215, wherein the x-axis represents time and the y-axis represents current magnitude. From time T1 to T2, MPS circuitry 215 outputs a short MPS pulse, optionally 7 ms long. From time T2 to T3, MPS circuitry 215 is arranged to not output an MPS pulse, optionally the off time lasting 250 ms. The period from time T1 to T3, comprising the MPS pulse and the off time, is denoted 320A, i.e. the cycle time.

Figure 2B:
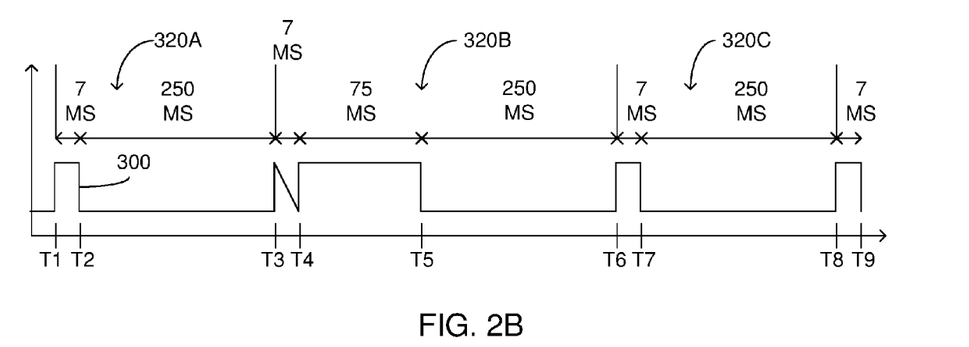
FIG. 2B illustrates a first graph of generated MPS pulses according to certain embodiments.

From time T3 to T4, MPS circuitry 215 again outputs a short MPS pulse. As illustrated, the short MPS pulse is disrupted by a change in PSE voltage causing current $i_C$. The interruption is sensed by control circuitry 220, and responsive thereto control circuitry 220 causes MPS circuitry 215 to output an additional MPS pulse from time T4 to T5 MPS. It is to be understood that there may be some time lag between the end of the output short MPS pulse and the beginning of the additional pulse due to logic delays, and thus the additional MPS pulse may not begin exactly at the beginning of time T4. Preferably, the additional MPS pulse is enabled in sufficient time to ensure that the PSE, irrespective of an additional noise event, recognizes the MPS before the end of the predetermined time window. From time T5 to T6, MPS circuitry 215 is arranged to not output an MPS pulse, optionally the off time lasting 250 ms as between times T2 to T3. The period from T3 to T6, comprising the disrupted MPS pulse, the second MPS pulse and the off time, is denoted 320B. As described above, in the event that the PSE doesn't detect an MPS after more than 320 ms of off time the port is shut down. In the embodiment where the off times are set to be 250 ms, the detected off time from T2 to T4 will be only 257 ms and the second MPS will be detected before shut off. As described above, in one embodiment the next MPS is generated after the 250 ms off time from T5 to T6, i.e. the MPS pulse timing is reset. In another embodiment, as described below in relation to FIG. 2C, the length of the off time from T5 to T6 is set such that period 320B is the same length as period 320A.

From time T6 to T7, MPS circuitry 215 again outputs a short MPS pulse, optionally 7 ms long, followed by an off time from time T7 to T8 of optionally 250 ms, the time period from T6 to T8 denoted 320C. Specifically, time period 320C is set to be equal to time period 320A. At time T9, MPS circuitry 215 is again arranged to output a short MPS pulse, as described above.

Figure 2C:
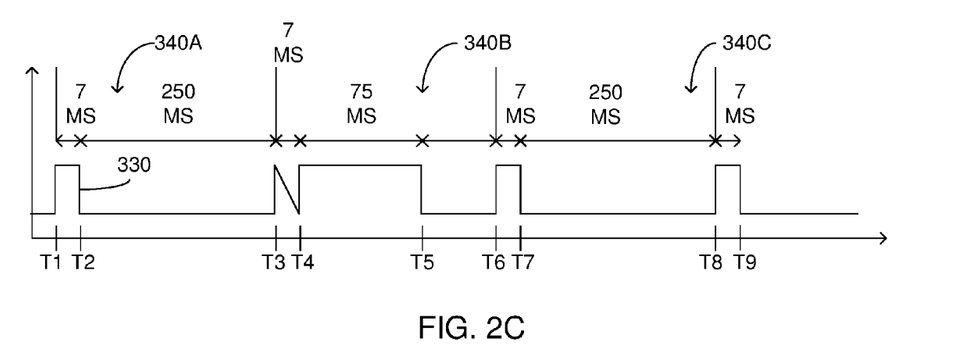
FIG. 2C illustrates a second graph of generated MPS pulses according to certain embodiments.

A second embodiment of MPS generation will be herein described in relation to FIG. 2C, which illustrates a graph 330 of the output of MPS circuitry 215, wherein the x-axis represents time and the y-axis represents current magnitude. Graph 330 is in all respects similar to graph 300 of FIG. 2B, with the exception that the length of the off time from time T5 to T6 is set such that the length of the period from time T3 to T6, denoted 340B, is equal to the length of the period from time T1 to T3, denoted 330A, and the length of the period from time T6 to T8, denoted 340C. Since all time periods 340A, 340B and 340C are equal, the operating frequency of MPS circuitry 215 is maintained, and timing of the MPS pulses are not adjusted responsive to generating the additional MPS pulse.

Figure 3:
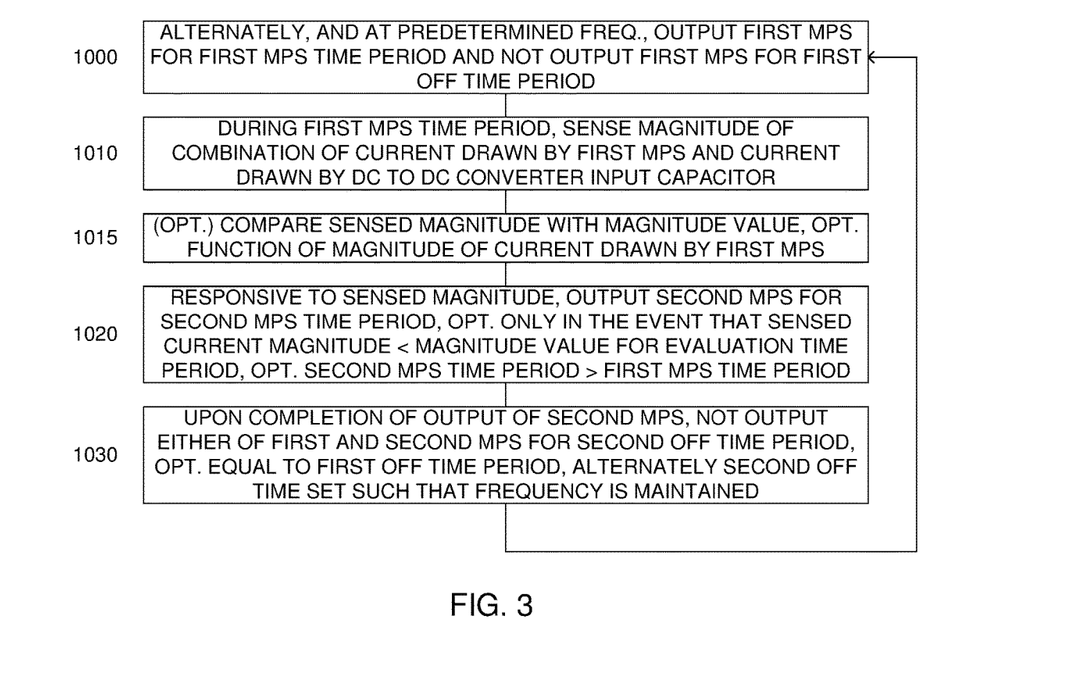
FIG. 3 illustrates a high level flow chart of a first MPS generation method according to certain embodiments.

FIG. 3 illustrates a high level flow chart of a first MPS generation method according to certain embodiments. In stage 1000, alternately, and at a predetermined frequency, a first MPS pulse is output for a predetermined first MPS time period, optionally 7 ms, and not output for a predetermined first off time period, optionally 250 ms. The first MPS pulse is output between a first terminal and a second terminal.

In stage 1010, during the first MPS time period of stage 1000, the magnitude of the combination of a current drawn by the output first MPS of stage 1000 and a current drawn by a capacitor coupled between the first terminal and the second terminal of stage 1000 is sensed. In optional stage 1015, the sensed current magnitude of stage 1010 is compared with a predetermined MPS minimum magnitude value, optionally 10 mA. Optionally, the predetermined MPS minimum magnitude value is a predetermined function of the nominal magnitude of the current drawn by the output first MPS of stage 1000. Further optionally, the predetermined MPS minimum magnitude value is equal to 0.5 mA less than the magnitude of the current drawn by the output first MPS pulse.

In stage 1020, responsive to the sensed current magnitude of stage 1010, a second MPS pulse is output for a predetermined second MPS time period. Optionally, the second MPS pulse is output only in the event that the sensed current magnitude is less than the predetermined MPS minimum magnitude value of optional stage 1015 for a predetermined evaluation time period, optionally 0.5 ms. Optionally, the predetermined second MPS time period is greater than the predetermined first MPS time period of stage 1000, optionally being 75 ms.

In stage 1030, upon completion of the output second MPS pulse of stage 1020, neither of the first MPS pulse or the second MPS pulse are output for a predetermined second off time period, i.e. an off period follows stage 1020. Optionally, the length of the predetermined second off time period is generally equal to the length of the predetermined first off time period of stage 1000. Alternately, the length of the predetermined second off time period is set such that the predetermined frequency of stage 1000 is maintained. Particularly, as described above in relation to graph 2C, the length of period 340B is equal to the length of period 340A. Upon completion of the predetermined second off time period of stage 1030, stage 1000 is again performed.

Figure 4A:
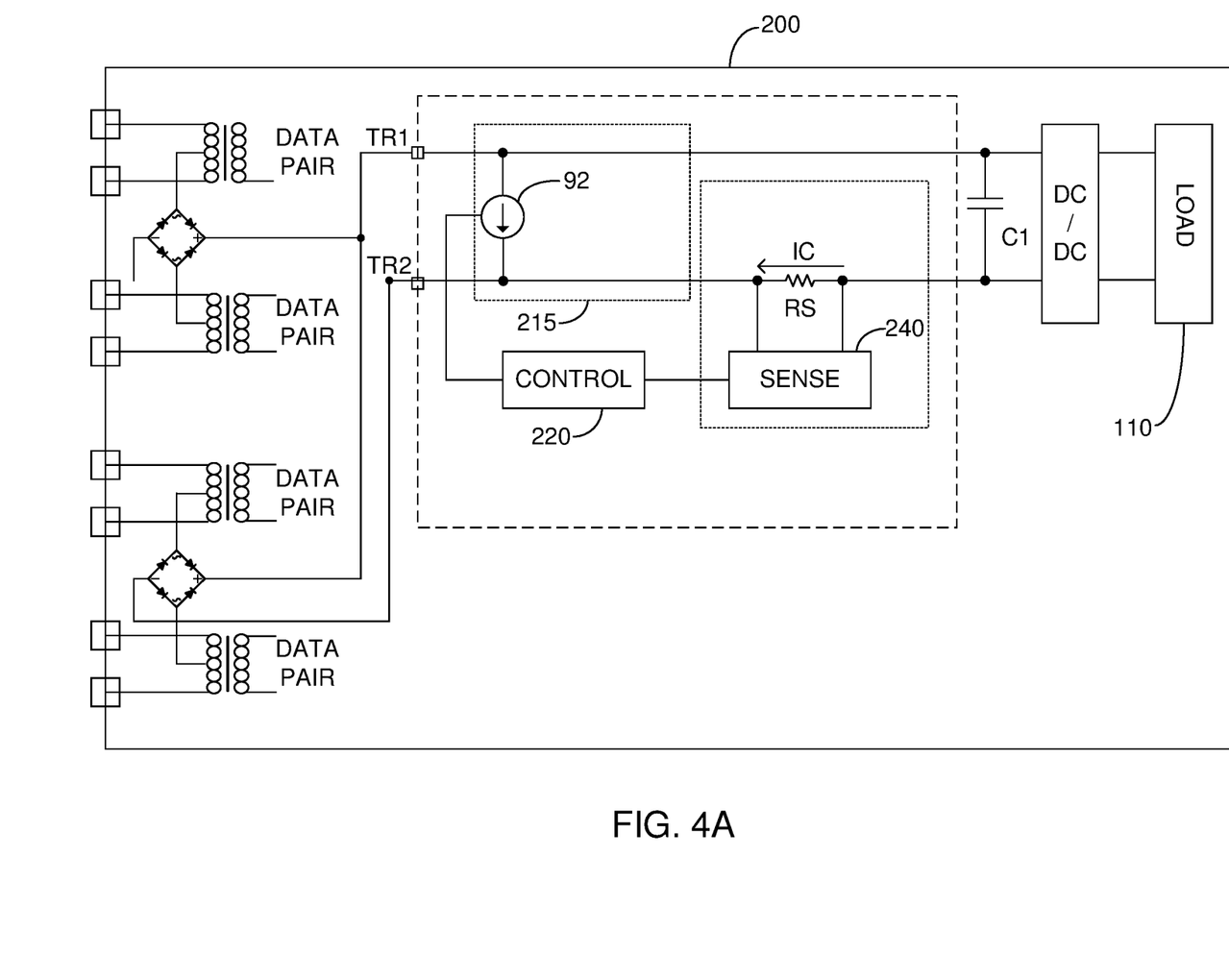
FIG. 4A illustrates a high level schematic diagram of a second embodiment of a PD according to certain embodiments.
Figure 4B:
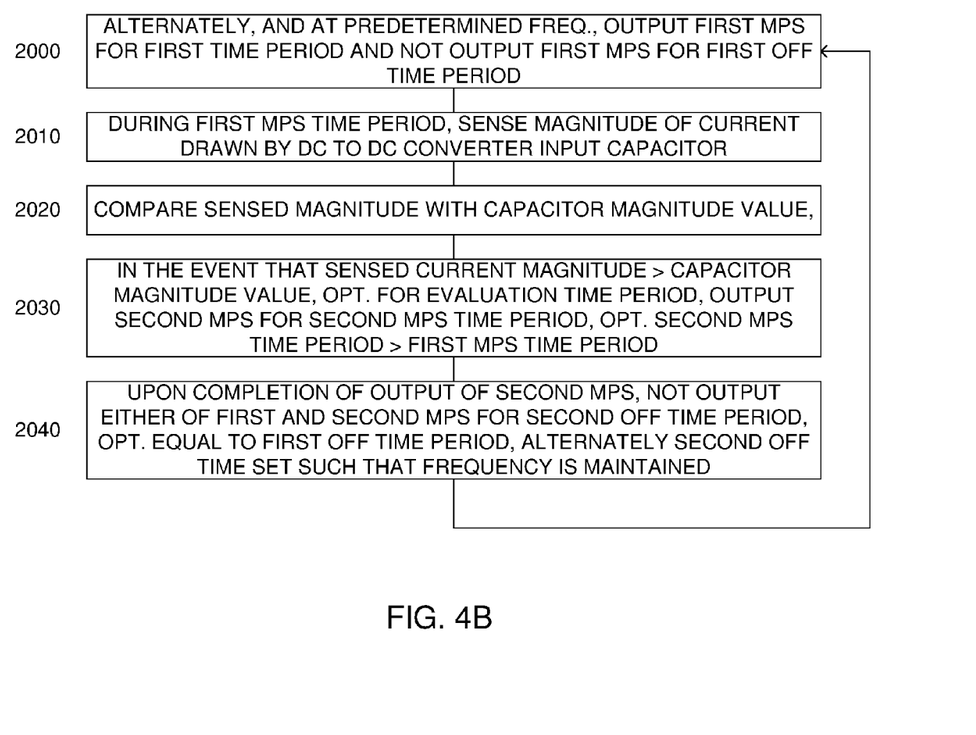
FIG. 4B illustrates a high level flow chart of a the method of operation of the PD of FIG. 4A according to certain embodiments.

FIG. 4A illustrates a high level schematic diagram of a PD 400 and FIG. 4B illustrates a high level flow chart of a method of operation of PD 400, FIGS. 4A and 4B being described together. PD 400 is in all respects similar to PD 200, with the exception that sense resistor RS is coupled between the second end of current source 92 of MPS circuitry 215 and the second end of capacitor C1. In another embodiment (not shown), sense resistor RS is coupled to the first end of capacitor C1.

In operation, in stage 2000, when load 110 is in a standby mode, alternately, and at a predetermined frequency, control circuitry 220 is arranged to control MPS circuitry 215 to generate a first MPS pulse for a predetermined first time period, optionally 7 ms, and not output for a predetermined first off time period, optionally 250 ms. The first MPS pulse is output to a PSE (not shown) between first terminal TR1 and second terminal TR2.

In stage 2010, during the first time period of stage 2000, sense functionality 240 is arranged to sense the magnitude of the current flowing through sense resistor RS, i.e. the magnitude of a current drawn by capacitor C1, denoted IC. In stage 2020, the sensed magnitude of current IC of stage 2010 is compared with a predetermined capacitor magnitude value. Particularly, the predetermined capacitor magnitude value is a magnitude great enough to disrupt the MPS of stage 2000, as described above. Optionally, the predetermined capacitor magnitude value is about 0.5 mA.

In stage 2030, in the event that the sensed current magnitude of stage 2010 is greater than the predetermined capacitor magnitude value of stage 2020, and of the appropriate sign so as to disrupt the MPS pulse from being read at the PSE, MPS circuitry 215 is arranged to generate a second MPS pulse for a predetermined second time period. Optionally, the second MPS pulse is output only in the event that the sensed current magnitude is greater than the predetermined capacitor magnitude value of stage 2020 for a predetermined evaluation time period, optionally 0.5 ms.

Optionally, the predetermined second time period is greater than the predetermined first time period of stage 2000, optionally being 75 ms.

In stage 2040, upon completion of the output second MPS pulse of stage 2030, neither of the first MPS pulse or the second MPS pulse are output for a predetermined second off time period, i.e. an off period follows stage 2030. Optionally, the length of the predetermined second off time period is generally equal to the length of the predetermined first off time period of stage 2000. Alternately, the length of the predetermined second off time period is set such that the predetermined frequency of stage 2000 is maintained, as described above in relation to optional stage 1030. Upon completion of the predetermined second off time period of stage 2040, stage 2000 described above is again performed.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description.

The invention claimed is:

1. A powered device (PD) interface comprising:
    a first terminal and a second terminal arranged for connection towards a power supply equipment;
    a maintain power signature (MPS) circuitry;
    a current sense circuitry arranged to sense the magnitude of a current flowing therethrough; and
    a control circuitry in communication with said current sense circuitry, said MPS circuitry responsive to said control circuitry,
    wherein said MPS circuitry is arranged, at a predetermined frequency, responsive to said control circuitry, to alternately:
        output a first current pulse for a predetermined first time period; and
        not output said first current pulse for a predetermined first off time period,
    upon completion of said output second current pulse, not output either of said first current pulse or said second current pulse for a predetermined second off time period having a length that is generally equal to the length of said predetermined first off time period; and
    upon completion of said second off time period, output said first current pulse;
    wherein said control circuitry is arranged, responsive to said sensed current magnitude, to determine the magnitude of a current drawn by an input capacitor of a direct-current to direct-current (DC to DC) converter, and
    wherein said control circuitry is arranged, responsive to said determined input capacitor current magnitude, to control said MPS circuitry to output a second current pulse for a predetermined second time period during said predetermined first off time period.

2. The PD interface of claim 1, wherein said current sense circuitry is coupled between said MPS circuitry and one of said first terminal and said second terminal, and
    wherein said input capacitor current magnitude determination comprises a comparison of said sensed current magnitude with the magnitude of said first current pulse.

3. The PD interface of claim 1, wherein said current sense circuitry is coupled between said MPS circuitry and the DC to DC converter input capacitor.

4. The PD interface of claim 1, wherein said predetermined second time period is greater than said predetermined first time period.

5. A maintain power signature (MPS) generation method, the method comprising:
    at a predetermined frequency, alternately outputting between a first terminal and a second terminal a first MPS current pulse for a predetermined first time period and not outputting said first MPS current pulse for a predetermined first off time period;
    during said first time period, determining the magnitude of a current drawn by an input capacitor of a direct-current to direct-current (DC to EXT) converter;
    responsive to said determined input capacitor current magnitude, outputting between the first terminal and the second terminal a second MPS current pulse for a predetermined second time period during said predetermined first off time period;
    upon completion of said output second current pulse, not outputting either of said first current pulse or said second current pulse for a predetermined second off time period having a length that is generally equal to the length of said predetermined first off time period; and
    upon completion of said predetermined second off time period, outputting said first current pulse.

6. The method of claim 5, wherein said input capacitor current magnitude determination comprises:
    sensing the magnitude of a combination of said output first MPS current pulse and the input capacitor current; and
    comparing said sensed combination current magnitude with the magnitude of said output first MPS current pulse, said second current pulse output only in the event that said sensed combination current magnitude is less than said current pulse magnitude for a predetermined evaluation time period.

7. The method of claim 5, wherein said input capacitor current magnitude determination comprises sensing the magnitude of current being drawn by the input capacitor.

8. The method of claim 5, wherein said predetermined second time period is greater than said predetermined first time period.

9. A powered device (PD) interface comprising:
    a first terminal and a second terminal arranged for connection towards a power supply equipment;
    a maintain power signature (MPS) circuitry;

a current sense circuitry arranged to sense the magnitude of a current flowing therethrough; and a control circuitry in communication with said current sense circuitry, said MPS circuitry responsive to said control circuitry, wherein said MPS circuitry is arranged, at a predetermined frequency, responsive to said control circuitry, to alternately:

output a first current pulse for a predetermined first time period; and not output said first current pulse for a predetermined first off time period, wherein said control circuitry is arranged, responsive to said sensed current magnitude, to determine the magnitude of a current drawn by an input capacitor of a direct-current to direct-current (DC to DC) converter, and wherein said control circuitry is arranged, responsive to said determined input capacitor current magnitude, to control said MPS circuitry to output a second current pulse for predetermined second time period during said predetermined first off time period;

wherein said MPS circuitry is further arranged to:

upon completion of said output second current pulse, not output either of said first current pulse or said second current pulse for a predetermined second off time period having a length set such that said predetermined frequency is maintained; and upon completion of said second off time period, output said first current pulse.

10. The PD interface of claim 9, where in said current sense circuitry is coupled between said MPS circuitry and one of said first terminal and said second terminal, and wherein said input capacitor current magnitude determination comprises a comparison of said current magnitude with the magnitude of said first current pulse.

11. The PD interface of claim 9, wherein said current sense circuitry is coupled between said MPS circuitry and the DC to DC converter input capacitor.

12. The PD interface of claim 9, wherein said predetermined second time period is greater than said predetermined first time period.

13. A maintain power signature (MPS) generation method, the method comprising:

at a predetermined frequency, alternately outputting between a first terminal and a second terminal a first MPS current pulse for a predetermined first time period and not outputting said first MPS current pulse for a predetermined first off time period;

during said first time period, determining the magnitude of a current drawn by an input capacitor of a direct-current to direct-current (DC to EXT) converter;

responsive to said determined input capacitor current magnitude, outputting between the first terminal and the second terminal a second MPS current pulse for a predetermined second time period during said predetermined first off time period;

upon completion of said output second current pulse, not outputting either of said first current pulse or said second current pulse for a predetermined second off time period having a length set such that said predetermined frequency is maintained; and upon completion of said predetermined second off time period, outputting said first current pulse.

14. The method of claim 13, wherein said input capacitor current magnitude determination comprises:

sensing the magnitude of a combination of said output first MPS current pulse and the input capacitor current; and comparing said sensed combination current magnitude with the magnitude of said output first MPS current pulse, said second current pulse output only in the event that said sensed combination current magnitude is less than the magnitude of said output first MPS current pulse for a predetermined evaluation time period.

15. The method of claim 13, wherein said input capacitor current magnitude determination comprises sensing the magnitude of current being drawn by the input capacitor.

16. The method of claim 13, wherein said predetermined second time period is greater than said predetermined first time period.

* * * * *